United States Patent [19]

Kawabuchi

[11] 4,451,544
[45] May 29, 1984

[54] MASK STRUCTURE FOR X-RAY LITHOGRAPHY AND METHOD FOR MANUFACTURING THE SAME

[75] Inventor: Katsuhiro Kawabuchi, Kamakura, Japan

[73] Assignee: Tokyo Shibaura Denki Kabushiki Kaisha, Kawasaki, Japan

[21] Appl. No.: 389,388

[22] Filed: Jun. 17, 1982

[30] Foreign Application Priority Data

Jun. 24, 1981 [JP] Japan .................................. 56-97705

[51] Int. Cl.$^3$ .............................................. G03F 9/00
[52] U.S. Cl. ........................................ 430/5; 430/313; 430/314; 430/323; 430/324; 430/966; 430/967; 204/18.1
[58] Field of Search ................... 430/5, 322, 323, 324, 430/966, 967, 321, 313, 314; 204/14 N, 18.1, 46 G; 156/659.1

[56] References Cited

U.S. PATENT DOCUMENTS 4,058,432 0/0000 Schuster-Woldan .
4,169,230 0/0000 Bohlen .
4,260,670 4/1981 Burns ..................................... 430/5

FOREIGN PATENT DOCUMENTS 53-17076 2/1978 Japan .
56-112727 9/1981 Japan .

OTHER PUBLICATIONS

Journal of Vacuum Science & Technology, vol. 16, No. 6, 1959, (1979); D. Maydan et al.; "Boron Nitride Mask Structure for X-ray Lithography".
Solid State Technology, Jul. 1972, D. L. Spears and I. Smith, "X-Ray Lithography A New High Resolution Replication Process".
8th International Conference on Electron and Ion Beam Science & Technology, May 1978, Seattle, H. Bohlen et al, pp. 420–430.
International Conference on Microlithography, Jun. 1977, Paris, B. Lischke et al, pp. 163–166.

Primary Examiner—John E. Kittle
Assistant Examiner—Jose' G. Dees
Attorney, Agent, or Firm—Oblon, Fisher, Spivak, McClelland & Maier

[57] ABSTRACT

The invention provides a mask structure for X-ray lithography, having a mask substrate of an X-ray transmitting material, a mask pattern of an X-ray absorbing material which is formed on the surface of the mask substrate or therein, a support ring for supporting the rear periphery of the mask substrate, and a lattice-shaped metal film embedded in a lattice-shaped slit in the mask substrate. The mask structure with a large area has a dimensional stability.

11 Claims, 15 Drawing Figures

F I G. 5A
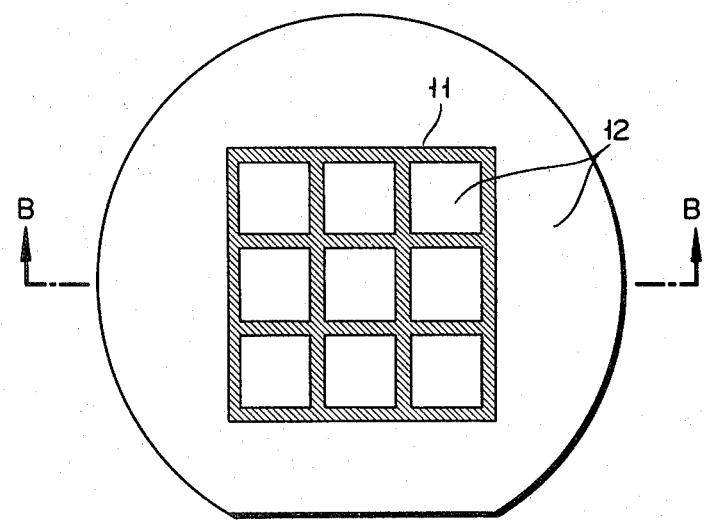
F I G. 5B
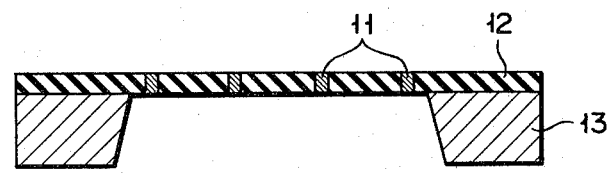

MASK STRUCTURE FOR X-RAY LITHOGRAPHY AND METHOD FOR MANUFACTURING THE SAME

BACKGROUND OF THE INVENTION

The present invention relates to a mask structure for X-ray lithography and a method for manufacturing the same.

Various lithography techniques have been recently developed to provide fine patterning of semiconductor devices with light rays, electron beams and X-rays. Among them, X-ray lithography is receiving a great deal of attention as a technique which can provide fine patterning in the order of submicrons. However, the following problems remain unsolved in a mask structure used in X-ray lithography.

FIG. 1 is a sectional view schematically showing a conventional mask structure for X-ray lithography. A mask pattern 2 comprising an X-ray absorbing material such as gold is formed on the surface of a substrate 1 comprising an X-ray transmitting material. Support members 3 are mounted on the lower surface of the substrate 1. The substrate 1 must be made of a material with a high X-ray transmittance and must have a thickness of not more than several μm. The substrate 1 is generally made of an inorganic material such as silicon oxide or silicon nitride. However, such a material is brittle and has a low mechanical strength, which does not allow enlargement of the area of the substrate 1 beyond several square millimeters. If a substrate has a large area, the support members 3 must be mounted at every several millimeters, resulting in a complex structure. Further, the width of the support member 3 is as wide as several mm. Portions of the substrate 1 which are supported by the support members 3 cannot be used for X-ray exposure. An effective area of the mask structure which is used as a mask is small.

Meanwhile, as shown in FIG. 2, if a substrate 4 is made of an organic material such as a synthetic resin instead of an inorganic material, the support members need not be used in great number. As a result, a mask structure of a large area can be achieved. However, the substrate 4 described above is so expandable and contractible that the mask dimensions may not be stabilized. The impreciseness of the substrate dimensions is a decisive drawback in fine patterning of the semiconductor device.

SUMMARY OF THE INVENTION

It is, therefore, an object of the present invention to provide a mask structure for X-ray lithography, which provides a substrate having a large area without forming a number of support members, and which achieves stable fine patterning.

It is another object of the present invention to provide a method for manufacturing such a mask structure for X-ray lithography.

According to one aspect of the present invention, there is provided a mask structure for X-ray lithography, comprising:

a mask substrate of an X-ray transmitting material;

a mask pattern of an X-ray absorbing material which is formed on a surface of said mask substrate or therein;

a support ring for supporting a rear periphery of said mask substrate; and a lattice-shaped metal film to be embedded in a lattice-shaped slit in said mask substrate.

According to another aspect of the present invention, there is also provided a method for manufacturing a mask structure for X-ray lithography, comprising the steps of:

(a) forming a mask substrate of an X-ray transmitting material on surfaces of a support plate;

(b) forming a lattice-shaped slit in said mask substrate;

(c) forming a lattice-shaped metal film by filling said lattice-shaped slit with a metal;

(d) forming a mask pattern of an X-ray absorbing material on a surface of said mask substrate or therein after or simultaneously with the formation of said lattice-shaped metal film; and (e) forming a support ring on a rear periphery of said mask pattern by selectively etching said support plate to leave a peripheral portion thereof.

BRIEF DESCRIPTION OF THE DRAWINGS

FIG. 5A is a plan view of a mask structure for X-ray lithography according to a second embodiment of the present invention;

FIG. 5B is a sectional view of the mask structure for X-ray lithography along the line B—B in FIG. 5A;

DETAILED DESCRIPTION OF THE PREFERRED EMBODIMENTS

Mask structures for X-ray lithography according to preferred embodiments of the present invention will be described with reference to the accompanying drawings.

Figure 1:
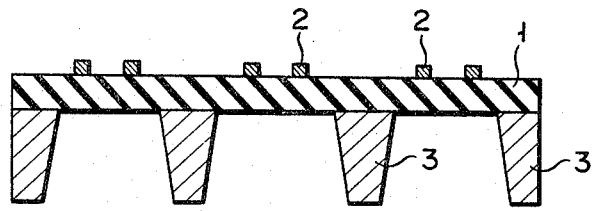
FIG. 1 is a sectional view of a conventional mask structure for X-ray lithography.
Figure 2:
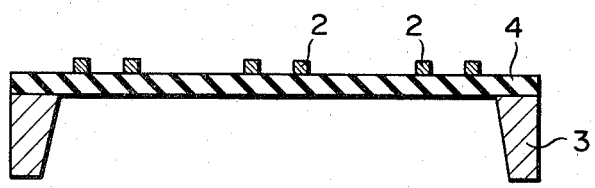
FIG. 2 is a sectional view of another conventional mask structure for X-ray lithography.
Figure 3A:
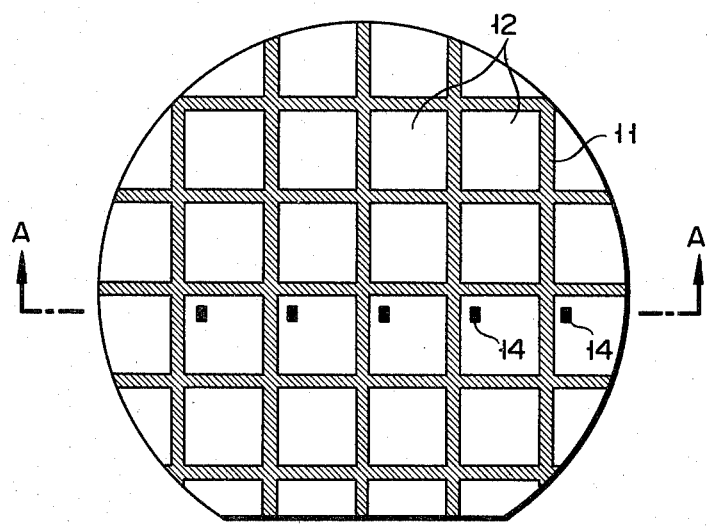
FIG. 3A is a plan view of a mask structure for X-ray lithography according to a first embodiment of the present invention.
Figure 3B:
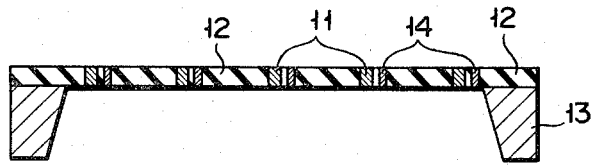
FIG. 3B is a sectional view of the mask structure for X-ray lithography along the line A—A in FIG. 3.

FIG. 3A is a plan view of a mask structure for X-ray lithography according to a first embodiment of the present invention, and FIG. 3B is a plan view thereof along the line A—A in FIG. 3A. Referring to FIGS. 3A and 3B, a lattice-shaped metal film 11 is embedded in a lattice-shaped slit formed in a mask substrate 12 of an X-ray transmitting material. The mask substrate 12 is divided into a plurality of substrate elements by the lattice-shaped metal film 11. Each substrate element is surrounded by the metal film 11. A ring-shaped support member 13 is formed on the rear periphery of a disc-shaped body made of the mask substrate 12 and the metal film 11. Slit pattern formed in the substrate elements of the mask substrate 12 which are divided by the metal film are filled with a mask pattern 14 of an X-ray absorbing material.

In the mask structure with the above arrangement, since the substrate elements which constitute the mask substrate 12 are surrounded by the elastic lattice-shaped metal film 11, the mask substrate 12 having a large area has a high mechanical strength and stable dimensions as a whole. Further, the width of the lattice-shaped metal film 11 is as small as 100μ, and the effective area which may be used for X-ray exposure is great. A semiconductor wafer is divided into chips by lattice-shaped dicing lines, and the mask pattern thereon is projected. Since the width of the dicing line is as small as about 100μ, the area of the mask substrate is effectively used if the lattice-shaped metal film 11 is formed corresponding to the positions of the dicing lines of the mask structure.

The X-ray transmitting material which constitutes the mask substrate 12 may comprise an inorganic material such as silicon oxide, silicon nitride, doped or undoped polycrystalline silicon, boron nitride, or a multi-layered structure thereof such as a two-layer structure of silicon oxide and silicon nitride, and a three-layer structure of silicon nitride, silicon oxide and silicon nitride. Alternatively, an organic material of a synthetic resin such as polyimide may be used. If an inorganic material is used which has stable dimensions for the mask substrate but which has a low mechanical strength, the mechanical strength is improved by the lattice-shaped metal film. However, if an organic material is used which has a high mechanical strength but which has unstable dimensions, the unstable dimensions are improved by the lattice-shaped metal film.

The lattice-shaped metal film may comprise any metal. However, if the lattice-shaped metal film is formed simultaneously as the mask pattern is formed, the same material as the mask pattern, that is, the X-ray absorbing material must be used. The X-ray absorbing material constituting the mask pattern may be a heavy metal such as gold and platinum.

A material constituting the ring-shaped support member may be silicon or glass.

A metod for manufacturing such a mask structure will be described below.

Figure 4A:
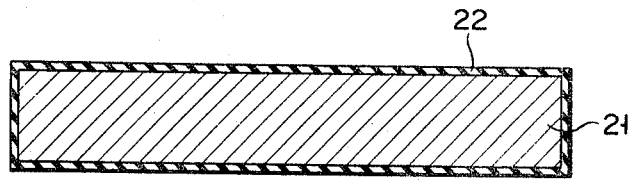
FIGS. 4A to 4F are sectional views for explaining the steps of manufacturing the mask structure shown in FIGS. 3A and 3B.
Figure 4B:
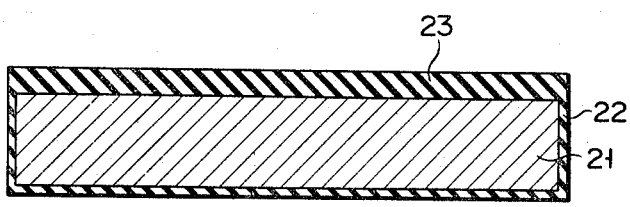
Figure 4C:
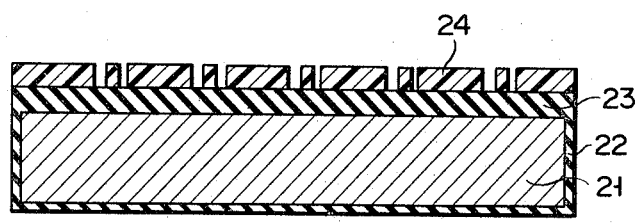

Referring to FIG. 4A, the surface of a silicon support plate 21 having a crystal orientation of (100), a resistivity of 0.001 Ω-cm, and a diameter of 4" is oxidized by thermal oxidation to form a thermal oxide film 22 of about 500 Å thickness. Thereafter, as shown in FIG. 4B, a silicon oxide film 23 of about 1 μm is deposited by the vapor growth method on the upper surface of the silicon support plate 21 through the thermal oxide film 22. A photoresist film is formed on the surface of the silicon oxide film 23 and is patterned by photolithography to form a resist pattern 24, as shown in FIG. 4C.

Figure 4D:
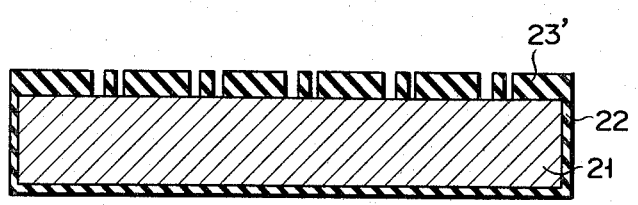
Figure 4E:
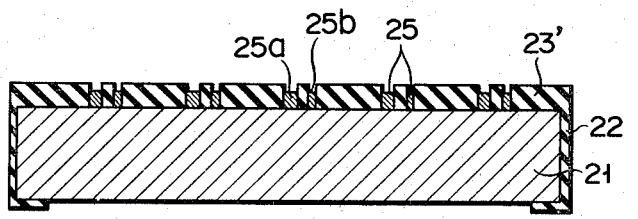
Figure 4F:
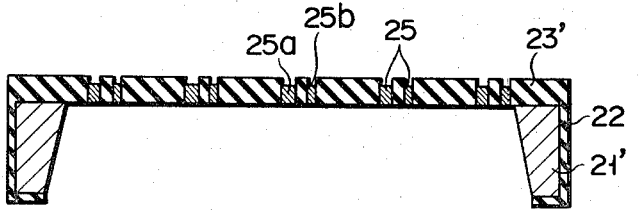

Using the resist pattern 24 as a mask, the oxide films 22 and 23 which are sequentially formed on the upper surface of the support plate 21 are selectively etched by reactive ion etching using a gas mixture of $CF_4$ and $H_2$ as a reactive gas. Thereafter, the resist pattern 24 is removed (FIG. 4D). An oxide film 23' having a desired pattern is obtained. The oxide film 23' corresponds to the mask substrate shown in FIGS. 3A and 3B. As shown in FIG. 4E, a gold film 25 of about 0.8 μm thickness is formed only in the slits of the oxide film 23'. The gold film 25 comprises a lattice-shaped metal film 25a and a mask pattern 25b. Thus, the lattice-shaped metal film 25a and the mask pattern 25b are simultaneously formed. Further, part of the thermal oxide film 22 at the central rear portion of the silicon support plate 21 is etched. Finally, the whole is dipped in an etching solution which contains KOH as the major component to leave only a peripheral portion 21' and to etch the 60-mm diameter portion of the silicon support plate 21. The peripheral portion 21' of the residual silicon support plate 21 corresponds to a support member 13 shown in FIG. 3B. Thus, the mask structure shown in FIGS. 3A and 3B is obtained.

According to the method for manufacturing the mask structure as described above, a special manufacturing step is not required. The insulating material is used as the mask substrate and electroplating is utilized to form the lattice-shaped metal film. Therefore, the lattice-shaped metal film and the mask pattern are simultaneously formed. If a conductive material such as impurity-doped polycrystalline silicon is used as the material of the mask substrate, the metal film cannot be selectively formed by electroplating only in the slits formed in the mask substrate. In this case, the following method is adopted. After predetermined slits are formed in the mask substrate, a metal is deposited by vacuum evaporation or the like on the entire surface including the inside portions of the slits. Thereafter, a resist film is formed on the metal film to a predetermined thickness and the surface of the resist film is made smooth. The metal film only on the mask substrate is etched by dry etching, so that the metal remains only in the slits.

The dimensional stability of the mask structure obtained in the above method is excellent, as is indicated by the standard deviation $2\sigma = 0.1$ μm.

FIG. 5A is a plan view of the mask structure for X-ray lithography according to a second embodiment of the present invention, and FIG. 5B is a sectional view thereof along the line B—B in FIG. 5A. The same reference numerals used in FIGS. 3A and 3B denote the same parts in FIGS. 5A and 5B and the mask pattern is omitted for illustrative convenience.

The mask structure for X-ray lithography in the second embodiment is the same as that in the first embodiment except that the lattice-shaped metal film 11 is formed only at the center of the mask structure. A method for manufacturing the mask structure in the second embodiment is the same as that in the first embodiment, so the same effects as in the first embodiment are obtained. The mask structure according to the second embodiment is employed to form the mask pattern only at the center thereof. In this case, the width of the ring-shaped support plate 21 of silicon is large enough, so the lattice-shaped metal film need not be formed at the periphery thereof.

Figure 6A:
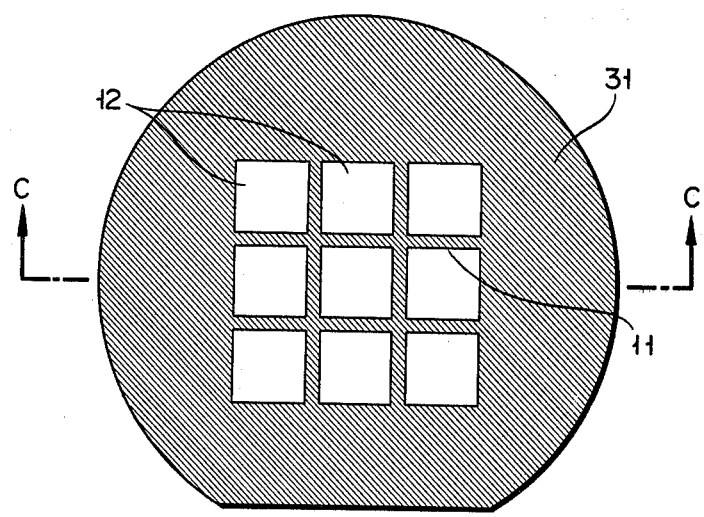
FIG. 6A is a plan view of a mask structure for X-ray lithography according to a third embodiment of the present invention.
Figure 6B:
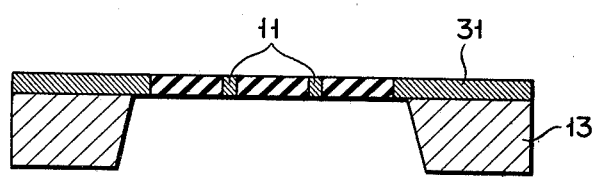
FIG. 6B is a sectional view of the mask structure for X-ray lithography along the line C—C in FIG. 6A.

FIG. 6A is a plan view of a mask structure for X-ray lithography according to a third embodiment of the present invention, and FIG. 6B is a sectional view thereof along the line C—C in FIG. 6A. The same reference numerals used in FIGS. 3A and 3B denote the same parts in FIGS. 6A and 6B, and the mask pattern is omitted in the same manner as in FIGS. 5A and 5B.

The mask structure for X-ray lithography in the third embodiment is the same as that in the first embodiment except that the lattice-shaped metal film 11 is formed at the center of the mask structure and a metal film 31 is formed therearound. The mask substrate at the periphery of the mask structure shown in FIGS. 5A and 5B is replaced with the metal film 31. A method for manufacturing the mask structure of the third embodiment is the same as that of the first embodiment, so that the same effects obtained in the first embodiment are obtained.

Figure 7:
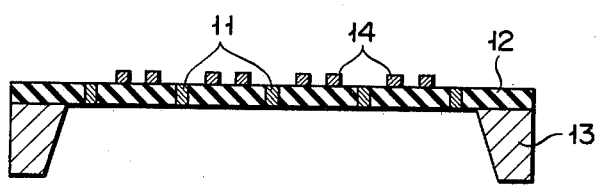
FIG. 7 is a sectional view of a modification of the mask structure according to the present invention.

In the preferred embodiments described above, the mask pattern is embedded in the slit formed in the mask substrate. However, the present invention is not limited to the above arrangement. For example, as shown in FIG. 7, the mask pattern 14 may be formed on the upper surface of the mask substrate 12.

What is claimed is:

1. A mask structure for X-ray lithography, comprising;
   a mask substrate of an X-ray transmitting material;
   a lattice-shaped metal film for reinforcing said mask substrate, and which is embedded in a lattice-shaped slit formed corresponding to the positions of the dicing lines of the mask structure;
   a mask pattern of an X-ray absorbing material which is formed on one of a surface of said mask substrate and in said substrate, and in the area surrounded by said lattice-shaped metal film; and
   a support ring for supporting a rear periphery of said mask substrate.

2. A structure according to claim 1, wherein said X-ray transmitting material is a member selected from the group consisting of silicon oxide, silicon nitride, polycrystalline silicon, boron nitride, a multi-layer structure thereof, and polyimide.

3. A structure according to claim 1, wherein said X-ray absorbing material is a member selected from the group consisting of gold and platinum.

4. A structure according to claim 3, wherein said lattice-shaped metal film is a member selected from the group consisting of a gold film and a platinum film.

5. A structure according to claim 1, wherein said support ring comprises a material selected from the group consisting of silicon and glass.

6. A structure according to claim 1, wherein said mask pattern is formed to be embedded in a slit formed in said substrate.

7. A method for manufacturing a mask structure for X-ray lithography, comprising the steps of:

(a) forming a mask substrate of an X-ray transmitting material on surfaces of a support plate;
   (b) forming a lattice-shaped slit in said mask substrate;
   (c) forming a lattice-shaped metal film by filling said lattice-shaped slit with a metal;
   (d) forming a mask pattern of an X-ray absorbing material on a surface of said mask substrate or therein after or simultaneously with the formation of said lattice-shaped metal film; and
   (e) forming a support ring on a rear periphery of said mask substrate by selectively etching said support plate to leave a peripheral portion thereof.

8. A method according to claim 7, wherein step (b) comprises the step of forming a slit pattern in said mask substrate so as to correspond to said mask pattern, and steps (c) and (d) comprise the step of filling said lattice-shaped slit and said slit pattern in said mask substrate with an X-ray absorbing metal.

9. A method according to claim 8, wherein said support plate comprises a conductive material, said mask substrate comprises an insulating material, and the step of filling said X-ray absorbing metal comprises the step of subjecting a structure obtained in step (b) to electroplating.

10. A method according to claim 9, wherein said support plate comprises silicon, and said mask substrate is made of a member selected from the group consisting of silicon oxide, silicon nitride, boron nitride, a multi-layer structure thereof, and polyimide.

11. A method according to claim 8, wherein the step of filling said X-ray absorbing metal comprises the steps of depositing said X-ray absorbing metal to cover the entire surface to a predetermined thickness, forming a smooth surface by coating a resist film, and etching said resist film and said X-ray absorbing metal to leave said X-ray absorbing metal only in said lattice-shaped slit and said slit pattern.

* * * * *